United States Patent [19]
Fujii et al.

[11] Patent Number: 5,138,422
[45] Date of Patent: Aug. 11, 1992

[54] SEMICONDUCTOR DEVICE WHICH INCLUDES MULTIPLE ISOLATED SEMICONDUCTOR SEGMENTS ON ONE CHIP

[75] Inventors: Tetsuo Fujii, Toyohashi; Susumu Kuroyanagi, Anjo; Yukio Tsuzuki, Nukata, all of Japan

[73] Assignee: Nippondenso Co., Ltd., Kariya, Japan

[21] Appl. No.: 790,025

[22] Filed: Nov. 6, 1991

Related U.S. Application Data

[60] Continuation of Ser. No. 536,465, Jun. 12, 1990, abandoned, which is a division of Ser. No. 260,997, Oct. 21, 1988, Pat. No. 4,963,505.

[30] Foreign Application Priority Data

Oct. 27, 1987 [JP] Japan ................. 62-271109
Nov. 30, 1987 [JP] Japan ................. 62-304340

[51] Int. Cl.$^5$ ............... H01L 27/02; H01L 27/12
[52] U.S. Cl. ............................. 357/49; 357/47
[58] Field of Search ................ 357/30, 47, 48, 49

[56] References Cited

U.S. PATENT DOCUMENTS

| | | | |
|---|---|---|---|
| 4,242,697 | 12/1980 | Berthold et al. | 357/49 |
| 4,283,235 | 8/1981 | Raffel et al. | 148/175 |
| 4,470,062 | 9/1984 | Muramatsu | 357/50 |
| 4,638,552 | 1/1987 | Shimbo et al. | 357/49 |

FOREIGN PATENT DOCUMENTS

| | | | |
|---|---|---|---|
| 0176747 | 4/1986 | European Pat. Off. | |
| 0217288 | 4/1987 | European Pat. Off. | 357/49 |
| 58-34943 | 3/1983 | Japan | |
| 61-59818 | 3/1986 | Japan | |
| 61-59853 | 3/1986 | Japan | |
| 62-193260 | 8/1987 | Japan | |

OTHER PUBLICATIONS

M. Shimbo et al., "Silicon-To-Silicon Direct ...", J. Appl. Phys., 15 Oct. 1986, pp. 2987-2989.

"Research and Development SOI Technology", Nikkei Microdevices, Mar. 1987, pp. 81-95.

"Dielectric Separation Type Intellignet..." [EDD-8-6-61] pp. 29-37.

Primary Examiner—Andrew J. James
Assistant Examiner—D. Monin
Attorney, Agent, or Firm—Cushman, Darby & Cushman

[57] ABSTRACT

Disclosed is a semiconductor device which comprises a substrate, an insulating film formed at a predetermined region in the substrate or on the main surface of the substrate, a polycrystalline semiconductor layer formed on at least the insulating film, a single crystal semiconductor layer formed on at least the polycrystalline semiconductor layer, an isolation region formed to extend from the top main surface of the single crystal semiconductor layer to at least the surface of the insulating film, through the polycrystalline semiconductor layer, to electrically isolate a portion formed in the single crystal semiconductor layer surrounded by the isolation region from another portion formed in the single crystal semiconductor layer and not surrounded by the isolation region, at least a semiconductor device formed within the portion surrounded by the isolation region. This semiconductor device has an additional characteristic in that another semiconductor device using another main surface of the substrate as the electrode is provided on the surface of the substrate and the single crystal semiconductor layer, and the plolycrystalline semiconductor layer serves to terminate the electric line of force emitted from the substrate, and therefore, the single crystal semiconductor layer mounted on the polycrystalline semiconductor layer is not affected by the electric line of force. Consequently, a semiconductor device which can operate effectively without being influenced by variations of the electric potential in the substrate can be obtained, and further, an intelligent type power device can be formed in which the power semiconductor device and the semiconductor device controlling the power device are formed in the same substrate but are completely isolated from each other.

3 Claims, 8 Drawing Sheets

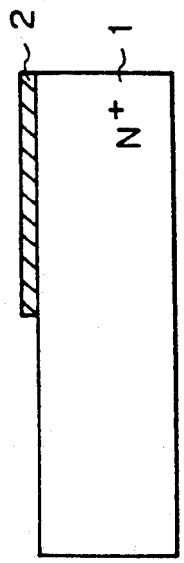
Fig. 2(a)
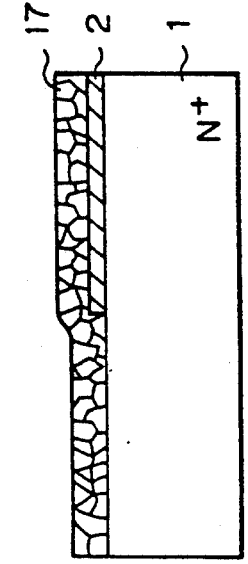
Fig. 2(b)
Fig. 2(c)
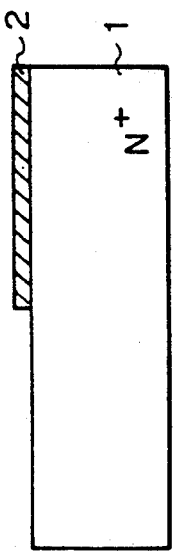
Fig. 3(a)
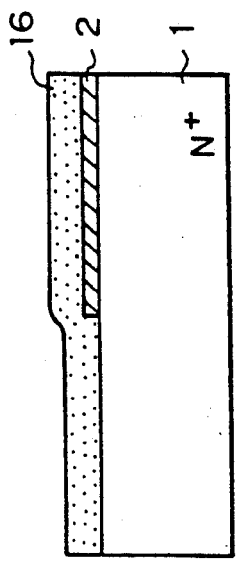
Fig. 3(b)
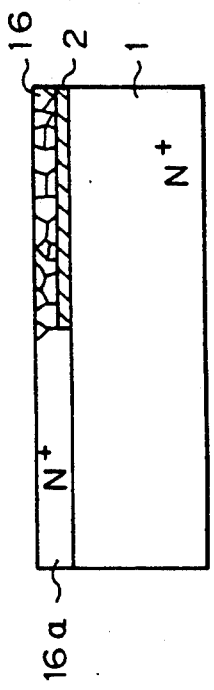
Fig. 3(c)

SEMICONDUCTOR DEVICE WHICH INCLUDES MULTIPLE ISOLATED SEMICONDUCTOR SEGMENTS ON ONE CHIP

This is a continutation of application Ser. No. 07/536,465, filed on Jun. 12, 1990, which was abandoned upon the filing hereof which is a division application of Ser. No. 07/260,997, filed Oct. 21, 1988, which is now U.S. Pat. No. 4,963,505, issued Oct. 16, 1990.

BACKGROUND OF THE INVENTION

1. Field of the Invention

This invention is related to a semiconductor device, more particularly, to a dielectric isolation type semiconductor device in which a plurality of semiconductor segments are integrated in one chip.

2. Description of the Related Art

Many kinds of structures for separating several semiconductor segments mounted on the same substrate in one semiconductor device are known, but recently, manufacturers have concentrated on the dielectric isolation type semiconductor device, due to its superior withstand voltage, capacity, processing speed, and leakage properties.

This structure for electrically isolating a plurality of semiconductor segments mounted on the same substrate is very important in the field of "intelligent" power devices, in which the plurality of semiconductor segments are mounted on the same substrate to form one chip, and accordingly, several proposals have been made with regard to the manufacture of such a semiconductor device.

For example, Japanese Unexamined Patent Publication 61-59853 discloses that such an isolation structure is produced by first preparing a semiconductor substrate having a silicon oxide film partially covering the surface thereof, and then connecting another semiconductor substrate to that surface to position the silicon oxide film inside of the stacked semiconductor layer, and thereafter, a plurality of oxide films, isolated from each other and extending vertically from the top surface of the substrate to the surface of the oxide film buried inside the substrate, are formed to isolate the portion surrounded by the oxide film buried inside the substrate and at least two of the vertical oxide films, from the other portion. This vertical oxide film is referred to hereinafter as the isolation region.

In this structure, however, the boundary face between the different substrates consists only of the oxide film, and therefore, the isolated portion can not be completely electrically isolated from the other portion, and accordingly, the characteristic of the semiconductor device formed in that portion will be affected by variations in the electric potential of the other substrate.

The article "Research and Development of SOI Technology Utilizing Oxygen Ion Implantation Improved by Completion of the High Current Ion Implanter" [NIKKEI MICRODEVICES, (March, 1987, pages 81 to 95)] shows that the formed isolated portion is surrounded by walls consisting of the silicon oxide films on a side portion thereof and a semiinsulating polycrystalline silicon layer as a bottom portion thereof.

But, in this structure, the semiinsulating polycrystalline silicon layer formed on the insulating film by utilizing the oxygen ion implantation method usually has a low electric conductivity, due to the presence of $SiO_2$ in the layer, and accordingly, the semiconductor device formed in that portion has inferior properties.

The article, "Dielectric Separation Type Intelligent Power Switch" [EDD-86-61, pages 29 to 37,] shows one process of manufacturing the dielectric isolation type semiconductor device. This process will be explained sequentially hereunder with reference to FIGS. 8(a) to 8(f).

As shown in FIG. 8(a), the surface of the N type silicon substrate 100, is given a mirror-finish and then subjected to an ion implantation of a high concentration of N type impurities, to form an N+ type silicon layer 105, and then the main surface of this N+ type silicon substrate 105 is oxidized to form an oxide film 106.

A separate N type silicon substrate 101 containing a high concentration of N type impurities (i.e., N+ type silicon substrate) is then prepared, the surface thereof is oxidized to form an oxide film 107, and that surface then treated to give it a mirror-finish.

Thereafter, as shown in FIG. 8(b), each of the main surfaces of these N type silicon substrates 100 and 101 are connected to each other, in such a way that both oxide films are indirect contact with each other, by a direct-connection method.

Next, as shown in FIG. 8(c), to form a lateral type power MOS transistor, etching is carried out on another main surface 108 of the predetermined region of the N type silicon substrate 100, opposite to the surface having the oxide film 106, to form a groove extending from the surface 108 to a portion inside the N+ type silicon substrate 101 beyond the oxide films 106, 107, whereby a portion of the silicon (Si) and a portion of the silicon oxide ($SiO_2$) are removed.

This etching operation must be repeated three times, since a different etchant is used for each N type silicon substrate 100 and 101, respectively, based on the type of oxide film thereon.

Then, as shown in FIG. 8(d), an epitaxial layer 102 having a predetermined concentration of N type impurities therein is epitaxially grown, and thereafter, the surface thereof is smoothed and brought to a predetermined thickness by etching, or by rubbing and grinding, as shown in FIG. 8(e).

Then, as shown in FIG. 8(f), a predetermined portion of the N type silicon substrate 100 is etched by reactive ion etching (RIE) to form a groove extending from the surface thereof to the oxide film 106, and thereafter, a thermal oxide film 103 is formed on the inside surface of the groove by thermal oxidation, and finally, the groove is filled with polycrystalline silicon 104.

Accordingly, the semiconductor device thus produced has a region A consisting of the N+ type silicon substrate 101 and the epitaxial layer 102, and a region B surrounded by the thermal oxide film 103 and the polycrystalline silicon 104, and these regions A and B are electrically isolated from each other by the thermal oxide film 103, the polycrystalline silicon 104, and the oxide films 106 and 107 disposed between the substrates 100 and 101.

Therefore, when an electric power segment, for example, a power MOS transistor or the like using another main surface 109 of the semiconductor substrate 101 as one electrode is provided in the portion A, and a semiconductor segment, for example, a bipolar transistor, a CMOSFET or the like, for controlling the electric power segment is provided on the surface of the portion B, an "intelligent" type power device can be constructed.

Nevertheless, the known semiconductor device constructed as described above still has drawbacks such that the oxide films 106 and 107 formed between the N type silicon substrates 100 and 101 can not completely electrically isolate the substrates 100 and 101, and further, the characteristics of the semiconductor segment formed in the region B are adversely affected by variations of the electrical potential of the N type silicon substrate 101. This occurs because, for example, when the electric potential of the N type silicon substrate 101 is varied in accordance with the operational condition of the electric power device provided in the region A, or due to external noise, the threshold voltage of a segment such as a MOSFET or the like provided in the region B will be greatly changed due to the occurrence of a back channel in the segment, caused by this variation.

A further drawback arises in that, during the manufacture of the known semiconductor device as described above, when forming a vertical type semiconductor segment, for example, a power MOS transistor, especially in the region A, a part of the N type silicon substrates 100 and 101 and a part of the oxide films 106 and 107 must be removed, and thereafter, the growth of the epitaxial layer 102 and the grinding operation for smoothing the surface thereof, to form the semiconductor segment thereon, must be carried out. Consequently, the whole process becomes complex, and thus the manufacturing yield is lowered, and accordingly, the production costs are increased.

SUMMARY OF THE INVENTION

Therefore, an object of this invention is to overcome the above technical drawbacks by providing a semiconductor device in which the segment of the semiconductor device provided in a region separated by dielectric isolation is not affected by variations of the electric potential of the base substrate.

Another object of the invention is to provide a method of manufacturing a dielectric isolation type semiconductor device by which the semiconductor device can be produced easily and at a reduced cost.

BRIEF DESCRIPTION OF THE DRAWINGS

FIGS. 2(a)-(c) are cross sectional views showing the sequence of the process of the second embodiment of the invention, respectively;

FIGS. 3(a)-(c) are cross sectional views showing the sequence of the process of the third embodiment of the invention, respectively;

DESCRIPTION OF THE PREFERRED EMBODIMENTS

Figure 1A:
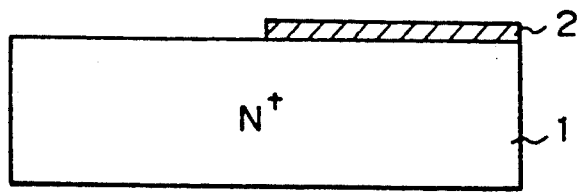
FIGS. 1(a)-(g) are cross sectional views showing the sequence of the process of the first embodiment of the invention, respectively.

The semiconductor device according to the present invention basically comprises a substrate; an insulating film formed at a predetermined region on the main surface of the substrate; a polycrystalline semiconductor layer formed at least on the insulating film; a single crystal semiconductor layer formed at least on the polycrystalline semiconductor layer; at least one isolation region extending from the top main surface of the single crystal semiconductor layer to at least the surface of the insulating film, through the polycrystalline semiconductor layer, to electrically isolate at least a portion formed in the single crystal semiconductor layer and surrounded by the isolation region from another portion formed in the single crystal semiconductor layer and not surrounded by the isolation region; and, at least a semiconductor element formed within the portion surrounded by the isolation region.

According to the semiconductor device of the present invention constructed as described above, the polycrystalline semiconductor layer serves to terminate the electric line of force emitted from the substrate, and therefore, the single crystal semiconductor layer mounted on the polycrystalline semiconductor layer is not affected by the electric line of force. Therefore, the semiconductor device of this invention can operate effectively without being affected by variations of the electric potential in the substrate.

In the present invention, the substrate is preferably a single crystal semiconductor layer, more preferably a single crystal silicon layer, and the insulating film partially formed on the surface of the substrate consists of $SiO_2$ or $Si_3N_4$.

The insulating film used in this invention is formed in such a way that first the whole surface of the substrate is oxidized, and thereafter, a part thereof is removed by etching, for example, utilizing a suitable mask, or the film is formed by oxidation while a mask partially covers the surface of the substrate.

In this invention, after the insulating film is formed on the predetermined portion of the surface of the substrate, the polycrystalline semiconductor layer is provided at least on the surface of the insulating film.

In this case, the polycrystalline semiconductor layer can be formed only on the surface of the insulating film, for example, by first forming the single crystal semiconductor layer by an epitaxial growth method using a suitable mask on the surface of the substrate on which the insulating film is not provided, and heating the layer to reduce it to a polycrystalline semiconductor layer, or by epitaxially growing the semiconductor layer on the whole surface of the substrate including the surface of the insulating film and heating the layer to reduce a portion of the layer existing on the surface of the insulating film to a polycrystalline semiconductor layer, and to reduce the rest of the portion of the layer on the surface of the substrate, but not covered by the insulating film, to a single crystal semiconductor layer.

In this invention, instead of using the epitaxial growth method, an amorphous semiconductor layer may be used to form the polycrystalline semiconductor layer as well as the single crystal semiconductor layer.

The semiconductor layer used in this invention may consist of silicon. Namely, the polycrystalline semiconductor layer used in this invention may be made of polycrystalline silicon, and similarly, the single crystal semiconductor layer used in this invention may be made of single crystal silicon.

In this invention, instead of the construction wherein the polycrystalline semiconductor layer is formed on the insulating film and the single crystal semiconductor layer is formed on the surface of the substrate, the polycrystalline semiconductor layer may be formed over the entire surface of the substrate. In this case, all portions of the substrate will consist of the polycrystalline semiconductor layer and the single crystal semiconductor layer, and this type of semiconductor device also can be used for any special purpose.

After the polycrystalline semiconductor layer and the single crystal semiconductor layer are formed simultaneously or sequentially, the surface thereof is smoothed, and thereafter, another single crystal semiconductor layer formed on both surfaces thereof. This layer may be formed by an epitaxial growth followed by a thermal treatment, or by stacking a previously prepared single crystal semiconductor layer on the surface of the layer.

In the basic construction of the semiconductor device of this invention, the bottom portion of the isolated portion consists of a combination of at least an insulating film such as $SiO_2$ and a polycrystalline semiconductor layer, although another combination such as that of an insulating film and an air gap also can be used.

In this case, at least the bottom portion of the isolated portion separated by the isolation region is not provided with the polycrystalline semiconductor layer, but nevertheless, this type of semiconductor device can give the same performance as the device described above.

The isolation region of this invention will be formed by making at least a groove extending from the top surface of the single crystal semiconductor layer to the surface of the insulating film inside of the substrate, to isolate the portion surrounded by the isolation region from the other portion, by using a known etching method and thermal heating method.

Note, the term, semiconductor element, as used in this invention refers to a basic unit which operates as, for example, a diode, a transistor, a resistor or the like, and is provided on or in the substrate to form a semiconductor device.

Hereinafter, the preferred embodiments of this invention will be described with reference to the accompanying drawings.

FIGS. 1(a)-(g) are cross sectional views showing the sequence of the process of the semiconductor device of the first embodiment of the present invention.

First, as shown in FIG. 1(a), a thermal oxide film ($SiO_2$) 2 is partially formed on a predetermined surface of an N+ type silicon substrate 1 having a (100) crystal face and including a high concentration of N type impurities such as P, As and Sb or the like. This thermal oxide film 2 is formed, for example, to a thickness of 0.5 to 1.0 μm, in steam at a temperature of 1000° C., and a portion thereof removed by a known photolithography method.

Figure 4:
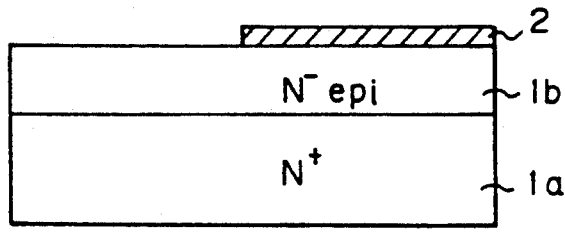
FIGS. 4 is a cross sectional view showing a modification of the substrate of the first embodiment of the invention.

As the substrate used in this invention, a substrate having an N− type epitaxial layer 1b including a low concentration of N type impurities and mounted on the N+ type silicon substrate 1a, as shown in FIG. 4, can be used.

Figure 1B:
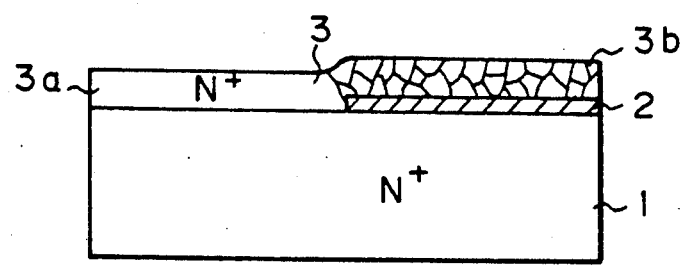

Further, in this invention as shown in FIG. 1(b), an epitaxial layer 3 including a high concentration of N type impurities is formed by the epitaxial growth method, while implanting impurities such as As, P or the like at a temperature of 1000° C., to a thickness of 0.5-5 μm. In this case, the epitaxial layer 3a formed directly on the N+ type silicon substrate 1 becomes a single crystal silicon layer substantially matching the crystal characteristics of the N+ type silicon substrate 1, but the epitaxial layer 3b formed on the thermal oxide film 2 becomes a polycrystalline silicon layer.

In this step, when the epitaxial layer is formed, first the layer is grown by the epitaxial growth method without introducing impurities therein, and thereafter, the N type impurities are introduced therein by the diffusion method, the ion implantation method, or the like.

Figure 1C:
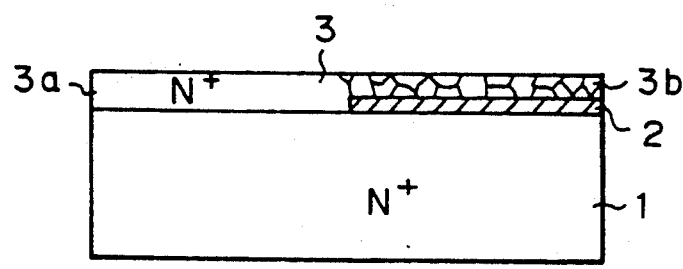

The substrate shown in FIG. 1(b) is referred to herein as the first semiconductor substrate having the insulating layer formed on a predetermined region in the substrate. Then, as shown in FIG. 1(c), the surface of the substrate is smoothed to a mirror-finish by grinding and polishing, to ensure that both the surface of the epitaxial layer 3a and the surface of the epitaxial layer 3b lie on the same plane.

Figure 1D:
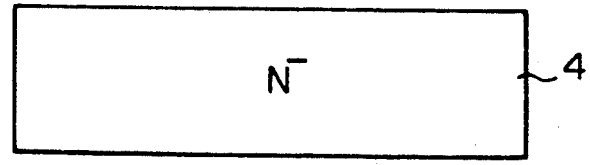

Next as shown in FIG. 1(d), another N− type silicon substrate 4 including a low concentration of impurities and having a crystal face of (100) and a resistance of 5–10 Ωcm, is prepared. This N− type single crystal silicon substrate 4 including impurities such as P, As, Sb or the like, is referred to herein as the second semiconductor substrate.

Figure 1E:
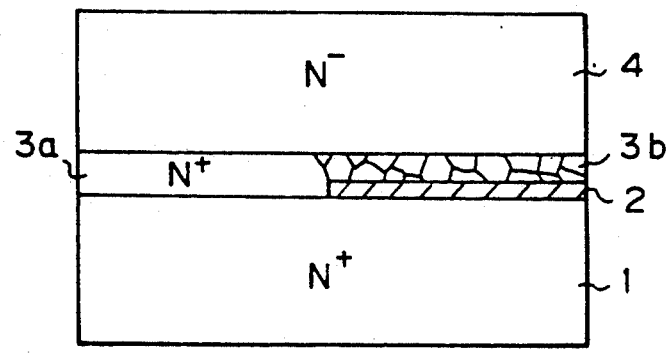

As shown in FIG. 1(e), the surface of the N− type silicon substrate 4, preferably after being ground and polished to a mirror-finish, is firmly connected to the surface of the epitaxial layer 3 by a direct connection method.

This connecting operation is carried out in such a way that, for example, first the surface thereof is cleaned to remove dust, acid, fat and oil components or the like, by the RCA cleaning method, in which solutions consisting of $H_2O_2+NH_4OH+H_2O$, $HF+H_2O$, and $H_2O_2+HCl+H_2O$, respectively, are applied thereto in that order, and the main surface of the N− type silicon substrate 4 having a mirror-finish and the main surface of the epitaxial layer 3 are placed in contact with each other, and the stacked structure is inserted into a furnace having a temperature of 800°–1200° C.

In FIG. 1(e), the N+ type silicon substrate 1 is at the lower portion of the entire stacked substrate and the N− type silicon substrate 4 is at the upper portion thereof.

In this construction, when a vertical type power MOS transistor, for example, is to be later formed, the portion connecting the epitaxial layer 3a and the N+ type silicon substrate 1 consists of single crystal silicon, and thus the resistance of the connecting portion is greatly reduced, to ensure that the semiconductor device has a high performance.

After the other surface of the N− type silicon substrate 4 is treated to bring the substrate 4 to a predetermined thickness, by removing a part of the component thereof by grinding, etching or the like, the groove extending from the top main surface of the N− type silicon substrate 4 to the surface of the thermal oxide film 2 is provided in the epitaxial layer 3b and N− type silicon substrate 4, by etching by the RIE method and using the silicon oxide film as a mask, for example.

The insulating layer 5 is formed on the inside wall of the groove by thermal oxidation or a CVD method, and successively, the groove is filled with the polycrystalline silicon 6 and then excess polycrystalline silicon projecting from the surface thereof is removed by grinding, and therefore, an isolation trench is finally formed.

The insulating film 5 is referred to as the isolation region in this invention. Further, the portions comprising the insulating film 5 and the polycrystalline semiconductor 6 disposed in the portion surrounded by the insulating film 5 are also referred to as isolation regions.

Figure 1F:
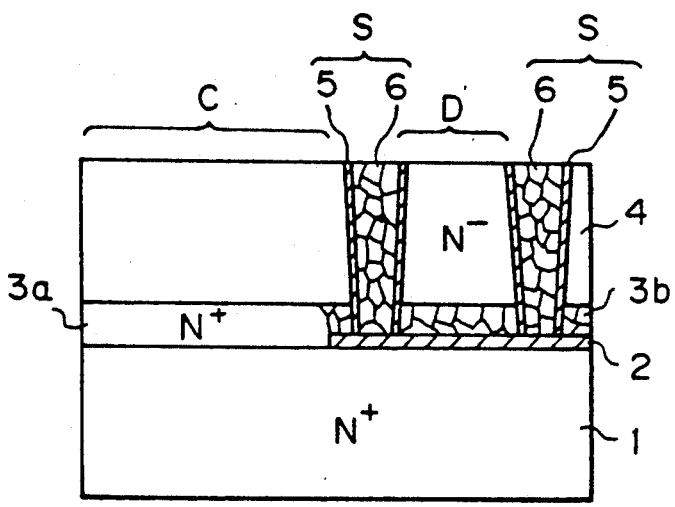

As shown in FIG. 1(f), the region D is an isolation portion defined and surrounded by the insulating film 5 and the thermal oxide film 2 provided on the N− type silicon substrate 4, and this region D is completely electrically isolated from the region C comprising the N− type silicon substrate 4, the epitaxial layer 3a, and the N+ type silicon substrate 1.

Figure 1G:
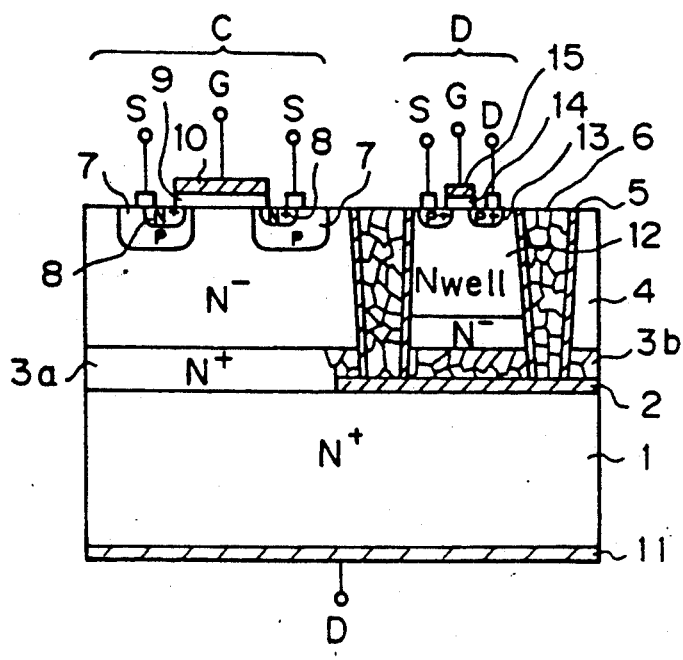

Then, as shown in FIG. 1(g), a P type diffusion layer 7, an N+ type diffusion layer 8, a gate insulating film 9, and a gate electrode 10, or the like are formed in the region C, by a known semiconductor fabricating technology, and a drain electrode 11 is formed on the other surface of the N+ type silicon substrate 1, whereby a power MOS transistor having a DMOS construction is formed in the region C.

In this invention, a group comprising, for example, a P type diffusion layer 7, an N+ type diffusion layer 8, a gate insulating film 9, and a gate electrode 10 or the like, is referred to as a semiconductor element as explained above.

In the region D, however, first an N well region 12 implanted with a predetermined concentration of N type impurities by diffusion or ion implantation, is formed, and then a semiconductor element comprising, for example, a P+ type diffusion layer 13 serving as the source and drain region, a gate insulating film 14, and a gate electrode 15 is provided on and in the N well region 12 to form a semiconductor device, for example, a P type channel MOS transistor.

Finally, the semiconductor device according to the first embodiment of this invention is completed by forming the electrode and wiring elements of the semiconductor element, and further, a surface protection film or the like is formed on each respective element of the semiconductor device.

In this embodiment, although a P type channel MOS transistor is formed after the N well region 12 is formed in the region D, an N type channel MOS transistor may be formed after the N well region 12 is formed in the region D and further, another semiconductor element such as a bipolar transistor, a logic circuit, or the like also can be formed in the same way. Namely, in this invention, a plurality of the regions D can be formed in the semiconductor device.

In the semiconductor device of the first embodiment of this invention, an element of the semiconductor device, for example, the MOS transistor formed in the region D, can operate without being affected by variations of the electric potential of the N+ type silicon substrate 1, since the epitaxial layer 3b consisting of polycrystalline silicon and located at the lower portion of the region D, contains many traps, and therefore, the epitaxial layer 3b serves as a shield layer for terminating the electric line of force emitted from the N+ type silicon substrate 1.

Further, when the semiconductor device of this invention is fabricated as an intelligent power device, as shown above, the electric potential of the N+ type silicon substrate 1 can be greatly varied but the other elements of the semiconductor device of this invention are not affected by such electric potential variations, and therefore, it is apparent that the construction of the semiconductor device of this invention is very useful when such an intelligent power device is to be formed.

Further, in the above embodiment, in the power MOS transistor formed in the region D, for example, since the N+ type silicon substrate 1 and the N− type silicon substrate 4 are connected by the epitaxial layer 3a of N+ type single crystal silicon, the resistance of portions in contact with each other is remarkably reduced, thus realizing a high performance.

Figure 8A:
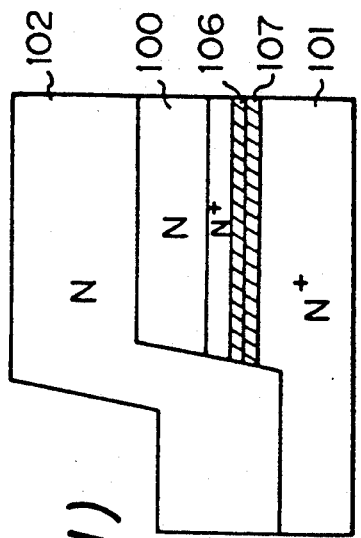
FIGS. 8(a)-(f) are cross sectional views showing the sequence of the process of the prior art, respectively.
Figure 8B:
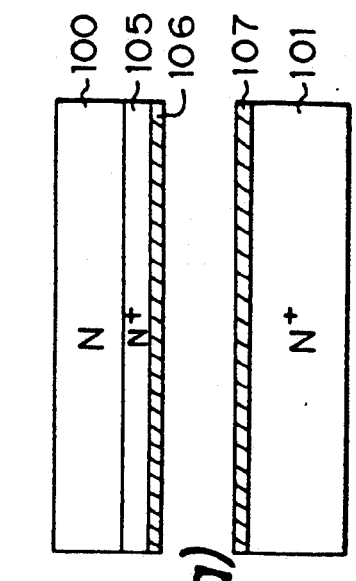
Figure 8C:
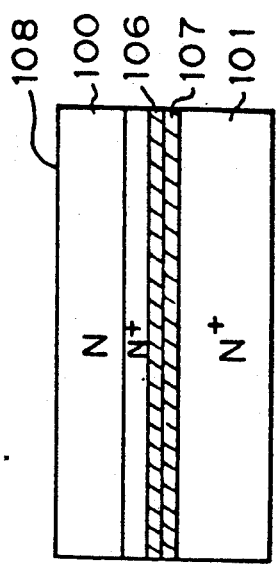
Figure 8D:
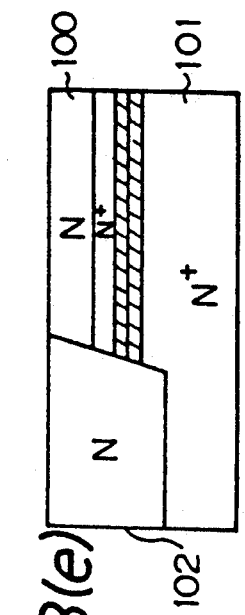
Figure 8E:
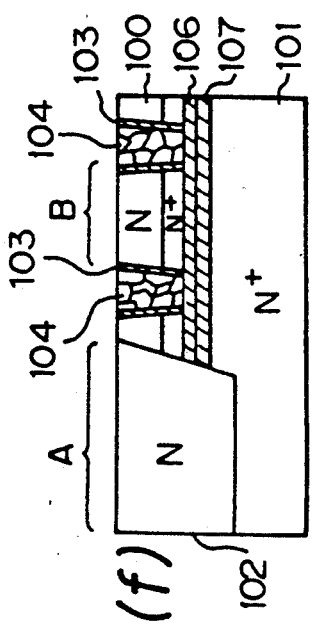
Figure 8F:
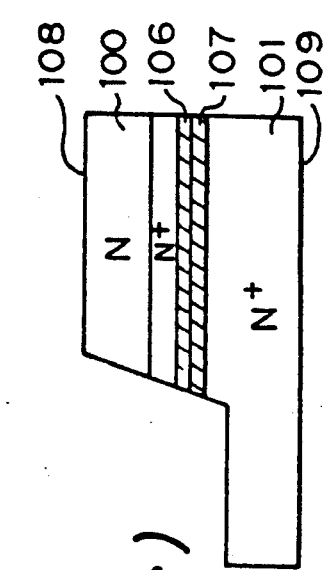

Moreover, when the method of manufacturing an intelligent power device of the above embodiment is compared with the conventional method of manufacturing such a device, as shown in FIG. 8, the etching operation must be carried out three times in the conventional method, as shown in FIG. 8(c), and further, since the epitaxial layer 102 grown by the epitaxial growth method must have a relatively thicker thickness, as shown in FIG. 8(d), the conventional process becomes more complex and the production costs are increased, but in the method of this invention, the above requirements are eliminated, and therefore, the manufacturing process of this invention is simpler and the production costs reduced.

Compared with the prior art shown in NIKKEI MICRO-DEVICES and described above, only a polycrystalline silicon layer is used as the bottom portion in this embodiment of the present invention, and although the electric conductivity thereof will be higher than that of the semi insulated polycrystalline semiconductor layer of the prior art, many traps exist inside the inventive layer, and thus a superior isolation effect can be obtained.

The second embodiment of this invention will be explained with reference to FIGS. 2(a)-(c).

First, as shown in FIG. 2(a), a thermal oxide film 2 is partially formed on a predetermined surface of the N+ type silicon substrate 1 and an amorphous silicon layer 16 is formed over the N+ type silicon substrate 2 by, for example, the plasma CVD method, as shown in FIG. 2(b). Then, as shown in FIG. 2(c), the layer 16 is subjected to a thermal treatment at a temperature of 500°–1100° C., to form a solid phase epitaxial growth layer.

At this time, most of the amorphous silicon layer 16a is reduced to a single crystal silicon having the same crystal characteristics as those of the N+ type silicon substrate 1, but the amorphous silicon layer 16b covering the thermal oxide film 2 is reduced to polycrystalline silicon.

Subsequently, N type impurities such as P, As or the like are implanted into the layer 16 by diffusion or ion implantation to a high concentration.

Note, when the amorphous silicon layer 16 is formed, a high concentration of the N type impurities may be simultaneously introduced therein.

The surface of the layer is then ground and polished to a mirror-finish, and the semiconductor device of this second embodiment is then constructed in the same way as explained in FIGS. 1(d) to 1(g) of the first embodiment.

The semiconductor device and the method of manufacturing the same of this second embodiment, provided the same effects as described in the first embodiment.

In this second embodiment, the amorphous silicon layer 16 can be formed in such a way that a polycrystalline silicon layer is first formed, and thereafter, the layer is reduced to the amorphous state by implanting ions such as Si, As, P or the like.

Further, when crystallizing the amorphous silicon layer 16 to form a single crystal silicon layer or polycrystalline silicon layer, a beam-melt method, for example, recrystallization by a laser, can be used in this invention.

The third embodiment of this invention will be explained with reference to FIGS. 3(a) to 3(c).

First, as shown in FIG. 3(a), a thermal oxide film 2 is partially formed on a predetermined surface of the N+ type silicon substrate 1, as explained in FIG. 1(a) of the first embodiment, and then a polycrystalline silicon layer 17 is formed over the N+ type silicon substrate 4 and the oxide film 2 by, for example, the LPCVD method, as shown in FIG. 3(b).

The surface of the layer is then ground and polished to a mirror-finish, and the semiconductor device of this third embodiment then constructed in the same way as shown in FIGS. 1(d) to 1(g) of the first embodiment.

The semiconductor device and the method of manufacturing the same of this third embodiment, provide the same effects as described in the first embodiment.

In this third embodiment, the polycrystalline silicon layer 17 is inserted between the N+ type silicon substrate 1 and the N− type silicon substrate 4, and therefore, the resistance of both layers is slightly increased. This will not be a problem unless the amount of electric power used exceeds a predetermined level.

The fourth embodiment of this invention will be explained with reference to FIGS. 5(a) to 5(e).

Figure 5A:
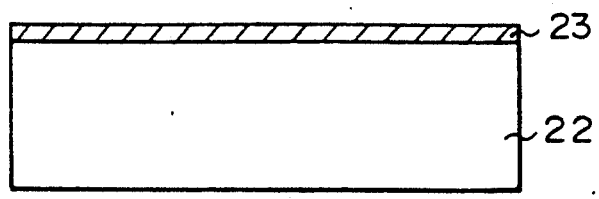
FIGS. 5(a)-(e) are cross sectional views showing the sequence of the process of the fourth embodiment of the invention, respectively.
Figure 5B:
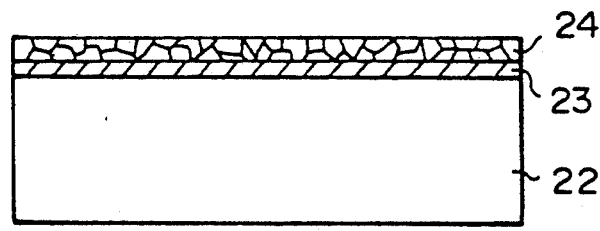

First, as shown in FIG. 5(a), an insulating layer 23 including a silicon oxide film or the like, is formed over the entire surface of the silicon substrate 22 and then, as shown in FIG. 5(b), a polycrystalline silicon layer 24 is formed over the insulating layer 23 by the LPCVD method, and thereafter, the surface thereof is ground and polished to a mirror-finish.

Figure 5C:
Figure 5D:
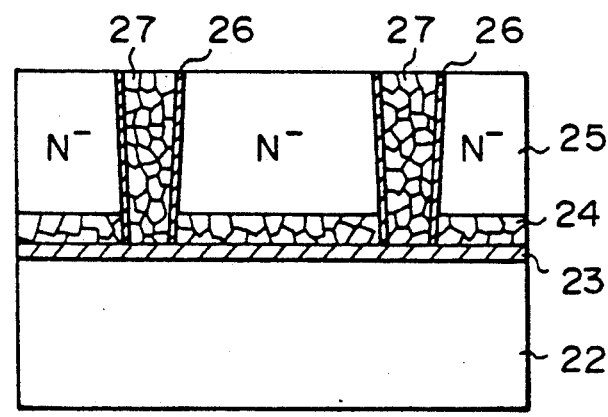

Then, as shown in FIG. 5(c), the N− type silicon substrate 25 including a low concentration of N type impurities is prepared, and as shown in FIG. 5(d), the main surface of the N− type silicon substrate 25 and the main surface of the polycrystalline silicon layer 24 are connected to each other by the direct connection method.

Successively, in the same way as described in the first embodiment, a groove extending from another main surface of the N− type silicon substrate 25 is provided in both the N− type silicon substrate 25 and the polycrystalline silicon layer 24, by etching.

Figure 5E:
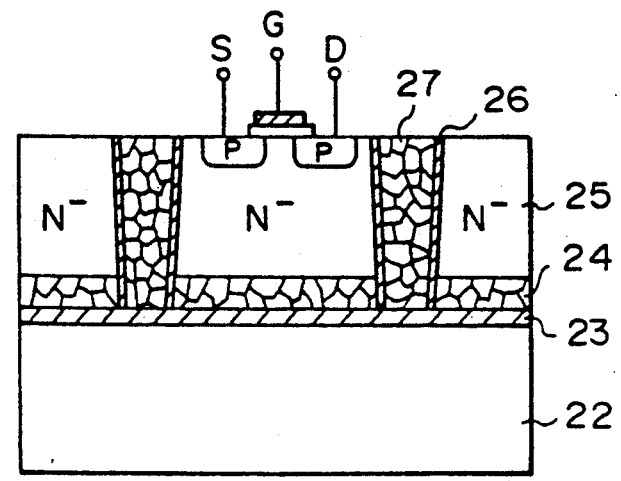

Subsequently, as shown in FIG. 5(e), a P type channel MOS transistor or the like, for example, is formed in the portion surrounded by the insulating layers 26 and 23 to make the semiconductor device of this invention.

As apparent from the description of the above embodiments, the present invention is not restricted to making an intelligent power device but may be effectively used for a semiconductor device or an element of a semiconductor device in which the electric potential of the silicon substrate 22, as the base substrate of the insulating film 23, is not fixed, for example, the substrate is in floating state.

In this fourth embodiment, as the base substrate of the insulating film 23, the semiconductor substrate 22 can be made of a material other than silicon, for example, a metal, dielectric or the like can be used. Further, the polycrystalline silicon layer 24 or the insulating film 23 may be formed on the surface of the N− type silicon substrate 25.

The fifth embodiment of this invention will be explained with reference to FIGS. 6(a) to 6(g).

Figure 6A:
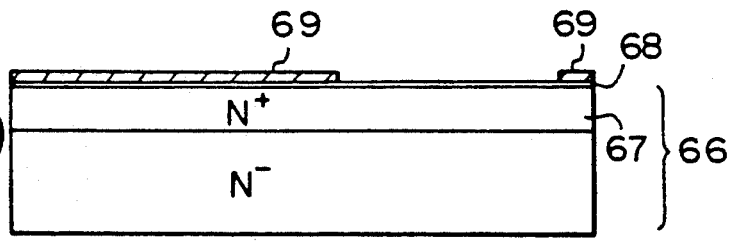
FIGS. 6(a)-(g) are cross sectional views showing the sequence of the process of the fifth embodiment of the invention, respectively.

As shown in FIG. 6(a), first an N+ type silicon layer 67 including P, As, Sb or the like as impurities is formed on a silicon substrate 66 as a first N type semiconductor substrate having, for example, a resistance of 5 to 10 Ω.cm and a crystal face of f(100), and thereafter, a pad silicon oxide film 68 having the thickness of 200 to 1000 Å is formed on the surface of the N+ type silicon layer 67 by oxidation.

Figure 6B:
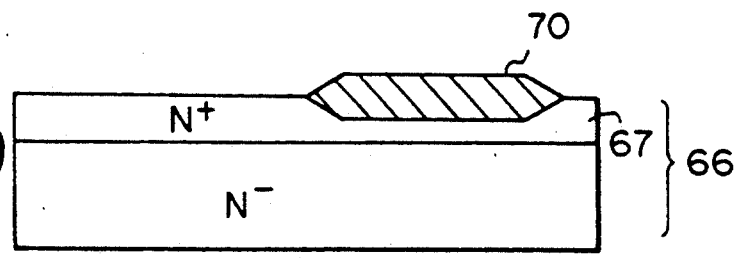
Figure 6C:
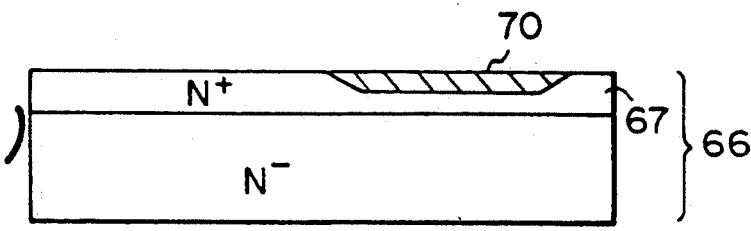

Further, a silicon nitride film ($Si_3N_4$) 69 having a thickness of 500 to 2000 Å is deposited on the surface of the silicon oxide film 68 by the LPCVD method and then a predetermined region of the silicon oxide film 68 is removed by a usual photolithographic etching method, followed by forming an insulating film 70 having a thickness of 1 to 2 μm in the region by a LOCOS oxidation method, as shown in FIG. 6(b), to provide a LOCOS region 70 consisting of $SiO_2$. Thereafter, the main surface of the substrate 66 is ground and polished to a mirror-finish as shown in FIG. 6(c).

Figure 6D:
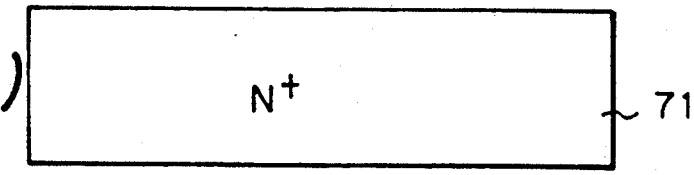

Then, as shown in FIG. 6(d), another silicon substrate 71 including a high concentration of P, As, or the like as impurities and having a crystal face of (100) is prepared, and the surface thereof also ground and polished to a mirror-finish. This semiconductor substrate is referred to as the second semiconductor substrate.

Subsequently, the main surfaces of the substrates 66 and 71 are cleaned to remove dust or fat and oil components by, for example, an RCA cleaning method or the like.

Figure 6E:
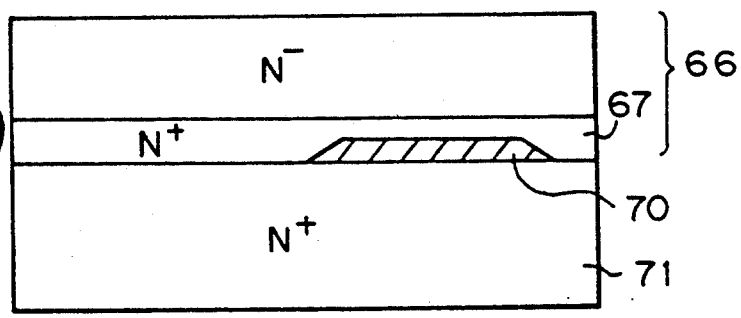

Thereafter, as shown in FIG. 6(e), the surfaces of the substrates 66 and 71 having a mirror-finish are placed in contact with each other and the connected body is inserted into a furnace heated to a temperature of 800° to 1200° C. to cause the two substrates 66 and 71 to adhere to each other by a direct contact therebetween.

Figure 6F:
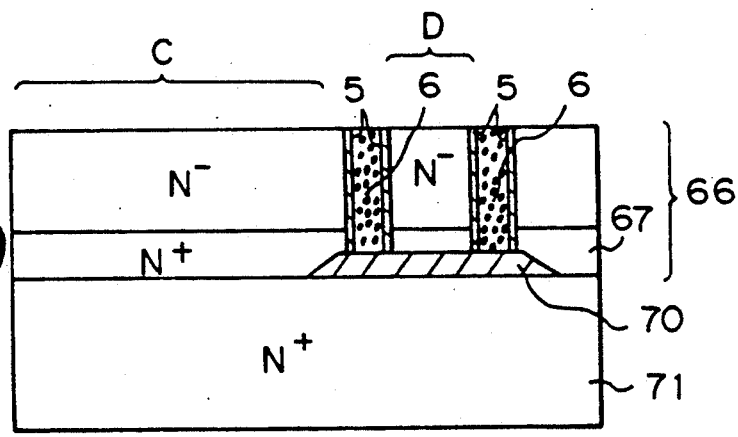
Figure 6G:
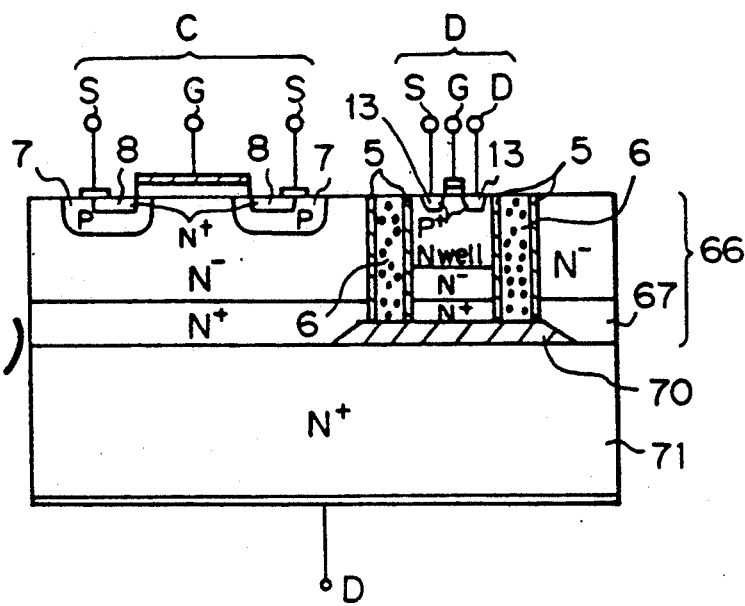

Successively, on the resultant adhered substrate, an isolation trench as shown in FIG. 6(f) is formed, and the respective semiconductor elements shown in FIG. 6(g) are formed on each portion in the same manner as shown in FIG. 1 of the first embodiment.

Figure 7A:
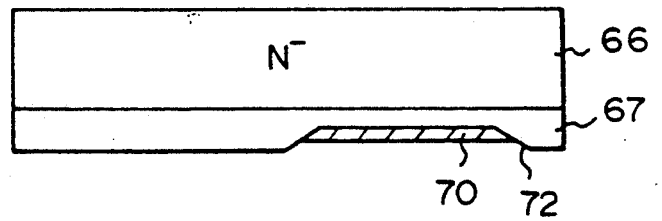
FIGS. 7(a)-(c) are cross sectional views showing the sequence of the process of the sixth embodiment of the invention, respectively.
Figure 7B:
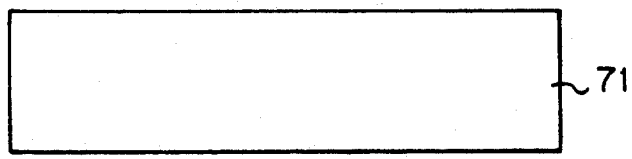
Figure 7C:
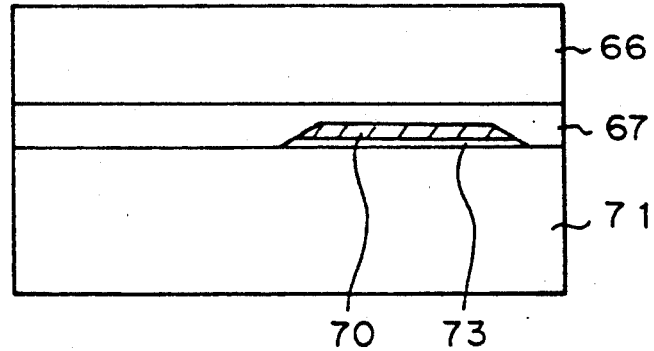

The sixth embodiment of this invention will be explained with reference to FIGS. 7(a) to 7(c).

As shown in FIG. 6 of the fifth embodiment, the main surface of the N− type silicon substrate 66 and the surface of the silicon substrate 71 are ground and polished to a mirror-finish and the thus-finished surfaces are placed in direct contact with each other. Note, in this embodiment, as shown in FIG. 7(a), a concave portion 72 is provided on the surface of the $SiO_2$ film so that the LOCOS region 70 consisting of the $SiO_2$ film is not in direct contact with the surface of the silicon substrate 71. Namely, when the surface of the silicon substrate 71 as the second semiconductor substrate as shown in FIG. 7(b), is placed in contact with the surface of the N− type silicon substrate 66 having the concave portion 72 therein, as shown in FIG. 7(c), a gap 73 is created between the surface of the LOCOS region 70 consisting of the $SiO_2$ film and the surface of the silicon substrate 71.

This construction can be obtained by removing a predetermined amount of the surface of the LOCOS region 70 consisting of the $SiO_2$ film by etching with an $SiO_2$ etchant after the LOCOS process is completed, or the gap 73 can be obtained by removing a small amount of the surface of the LOCOS region 70 consisting of the SiO$_2$ film by etching, utilizing an etchant consisting of an HF solution (hydrofluoric acid solution) after the surface thereof has been ground and polished to a mirror-finish.

In this kind of integrated semiconductor circuit, preferably the drain of the vertical power MOS is connected directly to the diffusion region through the silicon substrate, but it is not necessary for the silicon substrate 71 and the LOCOS region 70 consisting of the SiO$_2$ film to be in contact with each other.

Further, in this embodiment, since the gap 73 is created in that area, the region which is separated from the other region by the insulating materials, and is formed on the LOCOS region 70 consisting of the SiO$_2$ film 70, is completely isolated by the gap 73 and the LOCOS region 70 consisting of the SiO$_2$ film 70, both electrically and thermally, and thus the region has a preferable condition for a semiconductor device.

Note, the gap 73 does not affect the wafer processing operation because the gap 73 is embedded inside the silicon substrate.

In the fifth embodiment described previously, it is difficult to smooth the surfaces of the LOCOS region and the N+ type silicon layer 76, and a drawback arises in that the reliability of the semiconductor device will be decreased due to a difference in thermal expansion thereof. This problem, however, is completely solved in the seventh embodiment.

Although, this invention is described with reference to preferred embodiments, it is not restricted thereto, since it is apparent that this invention can be subjected to various modifications as long as they do not fall outside of the scope of this invention.

For example, the conductive type of the substrate may be changed from P type to N type, and vice versa, and more than one region surrounded by the isolation region may be provided as long as such regions are electrically isolated from the other regions.

As explained above, according to this invention, the semiconductor device of the invention is constructed in such a way that the polycrystalline semiconductor layer is formed on the surface of the insulating film and the semiconductor devices are formed in the region surrounded by the isolation region formed inside the single crystal semiconductor layer mounted on the polycrystalline semiconductor layer, and consequently, the semiconductor device of this invention can operate effectively without being influenced by variations of the electric potential in the substrate.

Further, according to this invention, a method of manufacturing the semiconductor device having the region formed by the dielectric isolation, simply and with a low production cost, can be provided.

Furthermore, in the prior art shown in Japanese Unexamined Patent Publication 61-59853, the isolation region is formed in the substrate in which the oxide film is not provided, but in this invention, the isolation region is formed at least in the substrate in which the oxide film is provided.

Accordingly, in the prior art, the surface of both the oxide film and the substrate must be given a mirror-finish, but in this invention, the surface of the substrate need not be so precise, and it is only preferable that the oxide film is provided in such a way that the surface thereof is in the same plane as the surface of the substrate, or is provided inside the substrate.

We claim:

1. A semiconductor device which comprises:
   a semiconductor substrate made of a single crystal semiconductor substance;
   an insulating film formed locally at a predetermined region on a main surface of the substrate;
   a polycrystalline semiconductor layer formed on said insulating film;
   a single crystal semiconductor layer formed on said substrate and on said polycrystalline semiconductor layer;
   at least one isolation region formed to extend from a top main surface of said single crystal semiconductor layer to at least a surface of said insulating film, through said polycrystalline semiconductor layer and formed substantially vertical to a surface of the substrate, so as to electrically isolate at least a first portion formed in said single crystal semiconductor layer which is provided on said insulating film and surrounded by said isolation region, from a second portion formed in said single crystal semiconductor layer which is provided on said substrate, and not surrounded by said isolation region;
   at least a first semiconductor device formed on a main surface of or inside said first portion, for controlling a device formed in a main surface of or inside said second portion; and
   at least a second semiconductor device formed on said main surface of or inside said single crystal semiconductor layer forming said second portion on said substrate and not provided with said insulating film thereon, and using another main surface of the substrate opposite to said main surface having said insulating film thereon as a drain electrode to form a power semiconductor device using said second semiconductor device which is controlled by said first semiconductor device, wherein said single crystal semiconductor layer formed on a surface of said substrate in said second portion comprises at least two different unit layers having different amounts of impurities therein, respectively, one of said unit layers adjacent to said substrate has a surface in a same plane as a surface of said polycrystalline semiconductor layer that is formed on the surface of said insulating film.

2. A semiconductor device according to claim 1, wherein said isolation region consists of a groove extended from a top surface of said single crystal semiconductor layer to at least a surface of said insulating film, a wall portion thereof being made of the insulating film and a portion existing between said wall portion thereof being filled with the polycrystalline semiconductor.

3. A semiconductor device according to claim 1, wherein said first portion is provided with a bottom portion comprising a single crystal semiconductor layer and a polycrystalline semiconductor layer, while on a main side surface of said first portion, mainly a single crystal semiconductor layer is in contact with said isolation region through an insulating film formed on an inner side surface of said isolation region.

* * * * *